United States Patent
Kim et al.

(10) Patent No.: US 7,187,214 B2
(45) Date of Patent: Mar. 6, 2007

(54) AMPLIFIER CIRCUIT HAVING CONSTANT OUTPUT SWING RANGE AND STABLE DELAY TIME

(75) Inventors: Nam-Seog Kim, Suwon-si (KR); Yong-Jin Yoon, Seoul (KR); Uk-Rae Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 35 days.

(21) Appl. No.: 11/071,433

(22) Filed: Mar. 3, 2005

(65) Prior Publication Data
US 2005/0194995 A1   Sep. 8, 2005

(30) Foreign Application Priority Data
Mar. 5, 2004   (KR) ............... 10-2004-0014953

(51) Int. Cl.
*H03K 5/22* (2006.01)
(52) U.S. Cl. ............... 327/77; 327/562; 327/563
(58) Field of Classification Search ........... 327/77, 327/72, 73
See application file for complete search history.

(56) References Cited

U.S. PATENT DOCUMENTS

| | | | | |
|---|---|---|---|---|
| 5,451,898 | A * | 9/1995 | Johnson | 327/563 |
| 6,191,624 | B1 * | 2/2001 | Matsuya | 327/77 |
| 6,501,317 | B2 * | 12/2002 | Lin et al. | 327/65 |
| 7,109,761 | B2 * | 9/2006 | Isomura | 327/77 |

FOREIGN PATENT DOCUMENTS

| | | |
|---|---|---|
| JP | 11-266152 | 9/1999 |
| JP | 15-188927 | 4/2003 |
| KR | 2002-001564 | 1/2002 |
| KR | 2002-044417 | 6/2002 |
| KR | 2002-058491 | 7/2002 |

* cited by examiner

*Primary Examiner*—Long Nguyen
(74) *Attorney, Agent, or Firm*—F. Chau & Associates, LLC

(57) ABSTRACT

Provided is an amplifier circuit having a constant output swing range and a stable delay time, where the amplifier circuit includes a first bias unit, a second bias unit, a comparison unit, and an amplifier unit, and the first bias unit responds to an internal reference signal with a predetermined voltage level and maintains constant the amount of a first current, and the second bias unit receives an external reference signal, responds to a control voltage, and controls the amount of a second current to be the same as the amount of the first current, and the comparison unit compares a voltage level of a first node with a voltage level of a second node, and controls a voltage level of the control voltage according to the comparison result, and the amplifier unit compares a voltage level of an external input signal with a voltage level of the external reference signal, amplifies and outputs a voltage difference between the two compared signals, responds to the control voltage, and controls the amount of a third current to be the same as the amount of the first current although the level of the external reference signal is varied, such that the amplifier circuit and a circuit for receiving data can maintain a constant output swing range and a stable delay time irrespective of variations in the voltage levels of the external input signal or the external reference signal.

12 Claims, 8 Drawing Sheets

(1) PRE-AMPLIFICATION (2) AMPLIFICATION (3) FINAL LATCH

US 7,187,214 B2

AMPLIFIER CIRCUIT HAVING CONSTANT OUTPUT SWING RANGE AND STABLE DELAY TIME

CROSS-REFERENCE TO RELATED APPLICATION

This application claims foreign priority under 35 U.S.C. § 119 to Korean Patent Application No. 2004-14953, filed on Mar. 5, 2004, in the Korean Intellectual Property Office, the disclosure of which is incorporated herein in its entirety by reference.

BACKGROUND OF THE INVENTION

1. Field of the Invention

The present disclosure relates to amplifier circuits, and more particularly, to amplifier circuits that are robust to variations in a voltage level of an external reference signal or an external input signal.

2. Description of the Related Art

In the semiconductor device field, as data transmission speeds between semiconductor chips is increasing, power consumed in data interfaces is also increasing.

In order to reduce power consumption, an attempt has been made to reduce an operating voltage level. However, it is more difficult for a data receiver to receive data when the operating voltage level is reduced, but noise in the interface is not reduced enough.

In particular, since the speed of the interface increases, the operating voltage level is reduced to prevent increasing power consumption, and a termination circuit is used to reduce noise between signals. Voltage levels of whole signals are reduced, thereby reducing drastically a swing range of an external signal input to an amplifier circuit.

FIG. 1 is a diagram for explaining a reduction in a swing range of an external input signal and variations in a delay time, indicated generally by the reference numeral 100. Referring to FIG. 1, a high level band VIHBAND in which the external input signal is recognized as a high level signal, and a low level band VILBAND in which the external input signal is recognized as a low level signal, are reduced gradually to a point where the bands become narrower than a reference signal band VREFBAND.

If the high level band VIHBAND and the low level band VILBAND are reduced and a level of a reference signal is varied within the reference signal band VREFBAND, a valid window in which the external input signal can be recognized as a high level signal or a low level signal is reduced disadvantageously.

FIG. 2 is a circuit diagram of a conventional amplifier circuit. Referring to FIG. 2, a conventional amplifier circuit 200 includes a bias unit 210, which generates a bias voltage VBIAS having a constant voltage level, and an amplifier unit 220, which responds to the bias voltage VBIAS and outputs amplified data.

The bias unit 210 includes first through fourth transistors TR1, TR2, TR3, and TR4, respectively, which build a current mirror. Since a power voltage VDD is applied to a gate of the third transistor TR3, the third transistor TR3 is always turned on, and accordingly, a gate of the first transistor TR1 changes to a low level due to a ground voltage VSS.

Therefore, the first transistor TR1 and the second transistor TR2 are turned on, and a first node N1 maintains a constant voltage level due to current flowing through the second transistor TR2. At this time, the amount of the current flowing through the second transistor TR2 can be controlled and the voltage level of the first node N1 can also be controlled by adjusting the size of the first transistor TR1 and the second transistor TR2. The voltage at the first node N1 makes the fourth transistor TR4 turn on, and is output as the bias voltage VBIAS. The bias voltage VBIAS output from the bias unit 210 is maintained constant.

The amplifier unit 220 includes fifth through ninth transistors TR5, TR6, TR7, TR8, and TR9, which amplify a voltage difference between an external reference signal XVREF and an external input signal XIN, and output, respectively, data DATA and inverted data DATAB through an output node OUTN and an inverted output node OUTNB.

The fifth transistor TR5 and the sixth transistor TR6 are turned on due to the ground voltage VSS connected to gates thereof, and a degree to which the seventh transistor TR7 and the eighth transistor TR8 are turned on is determined depending on voltage levels of the external reference signal XVREF and the external input signal XIN, respectively input to the fifth transistor TR5 and the sixth transistor TR6. The ninth transistor TR9 responds to the bias voltage VBIAS and determines the whole operation of the amplifier unit 220. That is, if the ninth transistor TR9 is turned on, the amplifier unit 220 operates, and if the ninth TR9 is turned off, the amplifier unit 220 does not operate. If the voltage level of the bias voltage VBIAS applied to the ninth transistor TR9 is constant, swing ranges of the data DATA and the inverted data DATAB output from the amplifier unit 220 are maintained constant.

The operation of the amplifier unit 220 is equal to that of a general differential amplifier, which is well known to one of ordinary skill in the pertinent art, and thus, a detailed explanation thereof will not be given.

FIG. 3A shows a graph 300 illustrating the external input signal and the external reference signal input to the amplifier circuit shown in FIG. 2. FIG. 3B shows a graph 350 illustrating the data output from the amplifier circuit shown in FIG. 2.

Referring to FIG. 3A, the voltage level of the external input signal XIN and the external reference signal XVREF is not constant, but is varied. That is, as the level of the external input signal XIN is varied, the level of the external reference signal XVREF is also varied to 0.55V, 0.75V, and 0.95V.

Accordingly, although the voltage level of the bias voltage VBIAS applied to the ninth transistor TR9 of the amplifier unit 220 is constant, if the level of the external input signal XIN and the level of the external reference signal XVREF are varied as shown in FIG. 3A, the swing ranges of the data DATA and the inverted data DATAB output from the amplifier circuit 200 are not constant and output delay times are increased.

This is because as the voltage levels of the external input signal XIN and the external reference signal XVREF are varied, a voltage level of a second node N2 of the amplifier unit 220 is varied. Referring to FIG. 3B, it can be seen that the swing range of the data DATA is not constant, as is shown by arrows (i), (ii), and (iii). Further, it can be seen that an output delay time TD taken from when data DATA is output to when next data DATA is output is relatively long.

As a result, the conventional amplifier circuit has poor performance in that when the voltage levels of the external input signal XIN and the external reference signal XVREF are varied, the output swing ranges are not constant and the output delay times are increased.

SUMMARY OF THE INVENTION

The present disclosure provides an exemplary amplifier circuit embodiment, which maintains a constant output swing range and a stable output delay time irrespective of variations in voltage levels of an external input signal and an external reference signal.

The present disclosure also provides an exemplary data receiving circuit embodiment comprising an amplifier circuit that maintains a constant output swing range and a stable output delay time irrespective of variations in voltage levels of an external input signal and an external reference signal.

According to an aspect of the present disclosure, there is provided an amplifier circuit comprising a first bias unit, a second bias unit, a comparison unit, and an amplifier unit. The first bias unit responds to an internal reference signal with a predetermined voltage level and maintains constant the amount of a first current. The second bias unit receives an external reference signal, responds to a control voltage, and controls the amount of a second current to be same as the amount of the first current.

The comparison unit compares a voltage level of a first node with a voltage level of a second node and controls a voltage level of the control voltage according to the comparison result. The amplifier unit compares a voltage level of an external input signal and a voltage level of the external reference signal, amplifies and outputs a voltage difference between the two compared signals, responds to the control voltage, and controls the amount of a third current to be same as the amount of the first current although the level of the external reference signal is varied.

The first current may flow through the first node, the second current may flow through the second node, and the amount of the second current may be varied in response to the voltage level of the external reference signal. The first bias unit may comprise first through third bias transistors. The first bias transistor may have a first terminal connected to a power voltage, a gate connected to a ground voltage, and a second terminal connected to the first node. The second bias transistor may have a first terminal connected to the first node, and a gate to which the internal reference signal is applied.

The third bias transistor may have a first terminal connected to a second terminal of the second bias transistor, a gate to which the internal reference signal is applied, and a second terminal connected to the ground voltage. The internal reference signal may make the second bias transistor and the third bias transistor turn on to maintain constant the amount of the first current. The second bias unit may comprise fourth through sixth bias transistors. The fourth bias transistor may have a first terminal connected to the power voltage, a gate connected to the ground voltage, and a second terminal connected to the second node. The fifth bias transistor may have a first terminal connected to the second node, and a gate to which the external reference signal is applied. The sixth bias transistor may have a first terminal connected to a second terminal of the fifth bias transistor, a gate to which the control voltage is applied, and a second terminal connected to the ground voltage.

The control voltage may control a degree to which the sixth bias transistor is turned on and control the amount of the second current to be the same as the amount of the first current. The comparison unit may have a negative terminal connected to the first node and a positive terminal connected to the second node, and reduce the voltage level of the control voltage if the voltage level of the second node is higher than the voltage level of the first node and increase the voltage level of the control voltage if the voltage level of the second node is lower than the voltage level of the first node.

The amplifier unit may comprise first through fifth transistors. The first transistor may have a first terminal connected to the power voltage, a gate to which a ground voltage is connected, and a second terminal connected to an output node. The second transistor may have a first terminal connected to the output node, a gate to which the external reference signal is applied, and a second terminal connected to a third node.

The third transistor may have a first terminal connected to the power voltage, a gate connected to the ground voltage, and a second terminal connected to an inverted output node. The fourth transistor may have a first terminal connected to the inverted output node, a gate to which the external input signal is applied, and a second terminal connected to the third node. The fifth transistor may have a first terminal connected to the third node, a gate to which the control voltage is applied, and a second terminal connected to the ground voltage.

According to another aspect of the present disclosure, there is provided a circuit for receiving data comprising an amplifier circuit, an internal latch circuit, and an external latch circuit. The amplifier circuit compares a voltage level of an external input signal with a voltage level of an external reference signal, amplifies and outputs a voltage difference between the two compared signals, responds to a control voltage, and maintains constant a swing range of output data.

The internal latch circuit stores and amplifies the data output from the amplifier circuit. The external latch circuit stores or outwardly outputs the data output from the internal latch circuit.

The amplifier circuit may comprise a first bias unit, a second bias unit, a comparison unit, and an amplifier unit. The first bias unit may respond to an internal reference signal with a predetermined voltage level and maintain constant the amount of a first current. The second bias unit may receive the external reference signal, respond to the control voltage, and control the amount of a second current to be the same as the amount of the first current. The comparison unit may compare a voltage level of a first node with a voltage level of a second node, and control a voltage level of the control voltage according to the comparison result.

The amplifier unit may compare the voltage level of the external input signal with the voltage level of the external reference signal, amplify and output the voltage difference between the two compared signals, respond to the control voltage, and maintain constant the swing range of the output data although the levels of the external reference signal and the external input signal are varied. The amplifier circuit may be turned on or off in response to a predetermined amplifier circuit driving pulse.

The internal latch circuit may comprise first through fourth internal latch transistors. The first internal latch transistor may have a first terminal connected to a power voltage, a gate connected to an inverted output node of the amplifier circuit, and a second terminal connected to an output node of the amplifier circuit.

The second internal latch transistor may have a first terminal connected to the power voltage, a gate connected to the output node of the amplifier circuit, and a second terminal connected to the inverted output node of the amplifier circuit. The third internal latch transistor may have a first terminal connected to the output node, a gate connected to the inverted output node, and a second terminal connected to an internal latch node.

The fourth internal latch transistor may have a first terminal connected to the inverted output node, a gate connected to the output node, and a second terminal connected to the internal latch node. The internal latch node may receive an internal latch circuit driving pulse for driving the internal latch circuit.

The external latch circuit may comprise an equalization transistor, a first transmission unit, a second transmission unit, and a latch unit. The equalization transistor may connect the output node to the inverted output node or cut off the output node from the inverted output node in response to an equalizing pulse. The first transmission unit may latch the data output from the output node or output the data through a first transmission node in response to a data control pulse.

The second transmission unit may latch the inverted data output from the inverted output node or output the inverted data through a second transmission node in response to the data control pulse. The latch unit may be connected between the first transmission node and the second transmission node, and store the data and the inverted data respectively output from the first transmission unit and the second transmission unit.

The first transmission unit may invert the data output from the output node and transmit the inverted data to the first transmission node if the data control pulse is at a first level, and float the first transmission node if the data control pulse is at a second level. The second transmission unit may invert the inverted data output from the inverted output node and transmit the inverted data to the second transmission node if the data control pulse is at the first level, and float the second transmission node if the data control pulse is at the second level. If the equalizing pulse is activated at the same time when the amplifier circuit driving pulse is activated, the amplifier circuit may amplify the data, and if the internal latch circuit driving pulse is activated, the equalizing pulse may be inactivated.

BRIEF DESCRIPTION OF THE DRAWINGS

The above and other features of the present disclosure will become more apparent by describing in detail exemplary embodiments thereof with reference to the attached drawings in which.

DETAILED DESCRIPTION OF PREFERRED EMBODIMENTS

Figure 1:
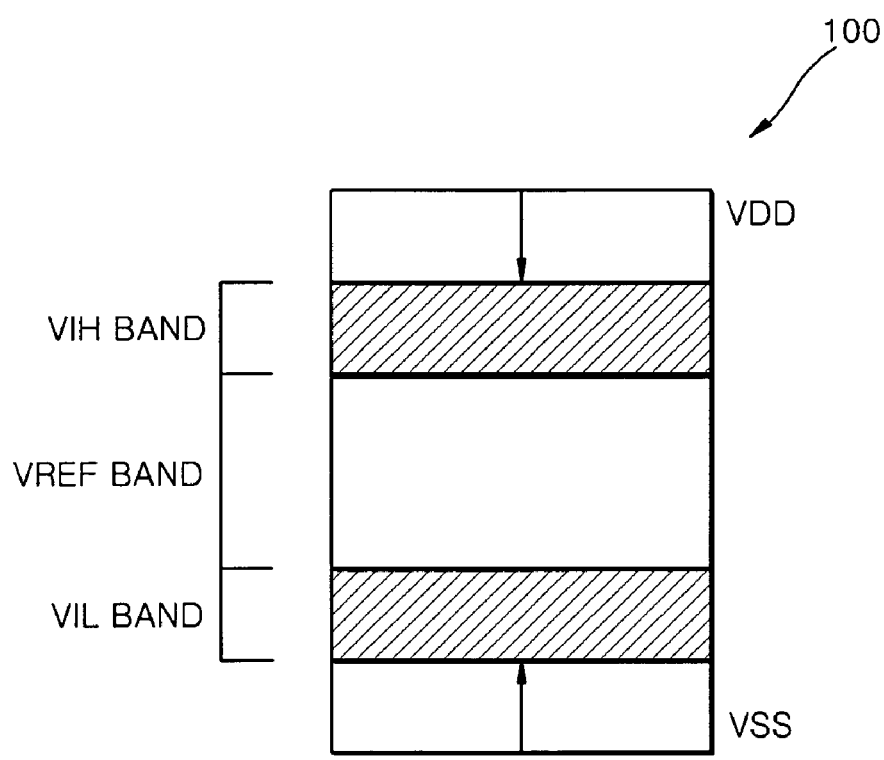
FIG. 1 is a diagram for explaining a reduction in a swing range of an external input signal and variations in a delay time.

Embodiments of the present disclosure will now be described more fully with reference to the accompanying drawings, in which preferred embodiments of the disclosure are shown. In the drawings, whenever the same element appears in a subsequent drawing, it may be denoted by the same reference numeral.

Figure 4:
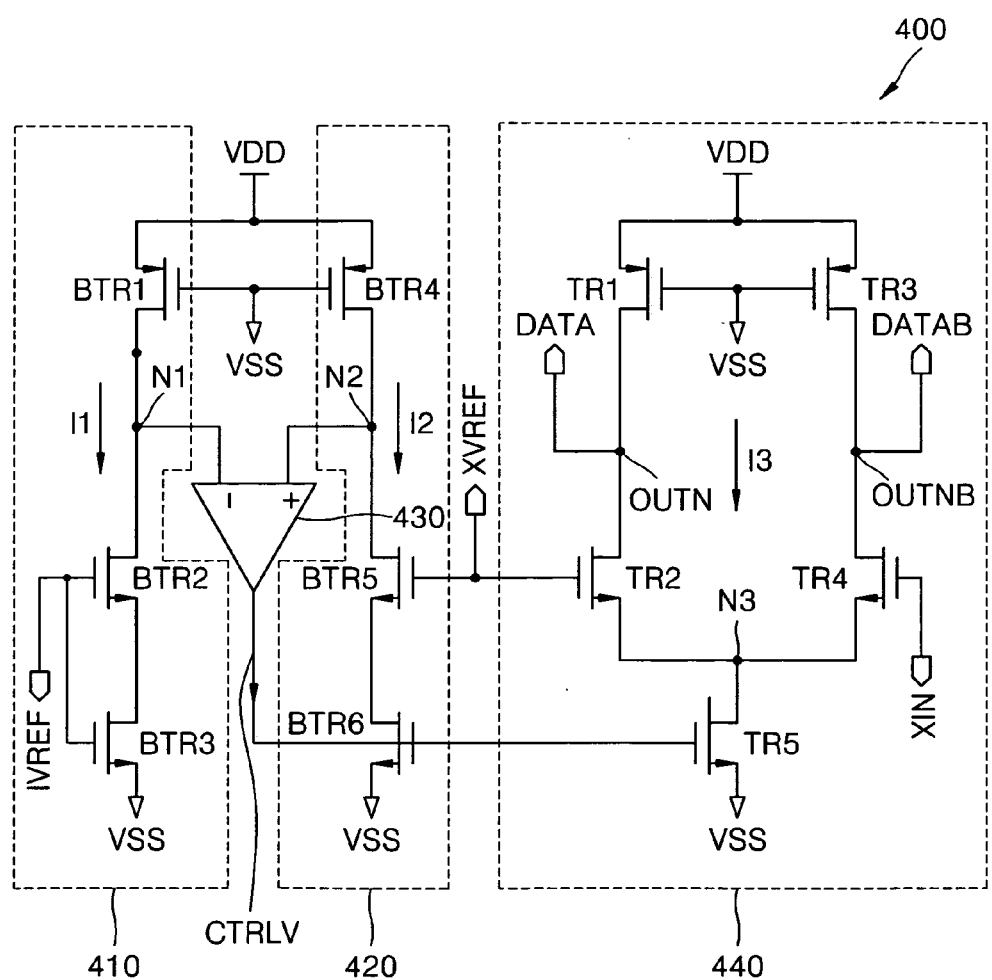
FIG. 4 is a circuit diagram of an amplifier circuit according to an exemplary embodiment of the present disclosure.

FIG. 4 is a circuit diagram of an amplifier circuit according to an exemplary embodiment of the present disclosure. Referring to FIG. 4, an amplifier circuit 400 includes a first bias unit 410, a second bias unit 420, a comparison unit 430, and an amplifier unit 440.

The first bias unit 410 responds to an internal reference signal IVREF with a predetermined voltage level and maintains constant the amount of a first current I1. The second bias unit 420 receives an external reference signal XVREF, responds to a control signal CTRLV, and controls the amount of a second current I2 to be the same as the amount of the first current I1.

The comparison unit 430 compares a voltage level of a first node N1 with a voltage level of a second node N2, and controls a voltage level of the control voltage CTRLV according to the comparison result. The amplifier unit 440 compares a voltage level of an external input signal XIN with a voltage level of the external reference signal XVREF, amplifies and outputs a voltage difference between the two compared signals, responds to the control signal CTRLV, and controls the amount of a third current I3 to be the same as the amount of the first current I1 even though the level of the external reference signal XVREF is varied.

The operation of the amplifier circuit 400 according to the present embodiment will be explained in detail with reference to FIG. 4. The first bias unit 410 includes first through third bias transistors BTR1, BTR2, and BTR3.

The first bias transistor BTR1 has a first terminal connected to a power voltage VDD, a gate connected to a ground voltage VSS, and a second terminal connected to the first node N1. The first bias transistor BTR1 is a P-channel metal oxide semiconductor (PMOS) transistor. Accordingly, the first bias transistor BTR1 is always turned on.

The second bias transistor BTR2 has a first terminal connected to the first node N1, and a gate to which the internal reference signal IVREF is applied. The third bias transistor BTR3 has a first terminal connected to a second terminal of the second bias transistor BTR2, a gate to which the internal reference signal IVREF is applied, and a second terminal connected to the ground voltage VSS.

The second and third bias transistors BTR2 and BTR3 are N-channel metal oxide semiconductor (NMOS) transistors. The first current I1 flows through the first through third bias transistors BTR1, BTR2, and BTR3.

The internal reference signal IVREF makes the second bias transistor BTR2 and the third bias transistor BTR3 turned on to maintain constant the amount of the first current I1. That is, if a voltage level of the internal reference signal IVREF is maintained constant, the amount of the first current I1 is maintained constant. Accordingly, the voltage level of the first node N1 is maintained constant.

The first bias unit 410 is a half circuit of the amplifier unit 440 that will be explained later, in that the size of the first bias transistor BTR1 is equal to that of a first transistor TR1 of the amplifier unit 440, and the size of the second bias transistor BTR2 is equal to that of a second transistor TR2 of the amplifier unit 440.

The second bias unit 420 includes fourth through sixth bias transistors BTR4, BTR5, and BTR6. The fourth bias transistor BTR4 has a first terminal connected to the power voltage VDD, a gate connected to the ground voltage VSS, and a second terminal connected to the second node N2. The second bias transistor BTR2 is a PMOS transistor. Accordingly, the second bias transistor BTR2 is always turned on.

The fifth bias transistor BTR5 has a first terminal connected to the second node N2, and a gate to which the external reference signal XVREF is applied. The sixth bias transistor BTR6 has a first terminal connected to a second terminal of the fifth bias transistor BTR5, a gate to which the control voltage CTRLV is applied, and a second terminal connected to the ground voltage VSS.

The control voltage CTRLV controls a degree to which the sixth bias transistor BTR6 is turned on, and controls the amount of the second current I2 to be the same as the amount of the first current I1. That is, if the voltage level of the external reference signal XVREF input to the fifth bias transistor BTR5 increases, the amount of the second current I2 flowing through the fifth bias transistor BTR5 increases.

Then, the control voltage CTRLV reduces the degree to which the sixth bias transistor BTR6 is turned on to reduce the amount of the second current I2. In this manner, the control voltage CTRLV controls the amount of the second current I2 to be the same as the amount of the first current I1.

The second bias unit 420 is a half circuit of the amplifier unit 440 in that the size of the fourth bias transistor BTR4 is equal to that of the first transistor TR1 of the amplifier unit 440, and the size of the fifth bias transistor BTR5 is equal to that of the second transistor TR2 of the amplifier unit 440.

The comparison unit 430 is a comparator. The comparator 430 has a negative terminal connected to the first node N1 and a positive terminal connected to the second node N2, and reduces the voltage level of the control voltage CTRLV if a voltage level of the second node N2 is higher than the voltage level of the first node N1.

To the contrary, the comparator 430 increases the voltage level of the control voltage CTRLV if the voltage level of the second node N2 is lower than the voltage level of the first node N1. The fact that the voltage level of the second node N2 is lower than the voltage level of the first node N1 means that the amount of the second current I2 is larger than the amount of the first current I1.

Then, the comparator 430 reduces the voltage level of the control voltage CTRLV to reduce the degree to which the sixth bias transistor BTR6 is turned on. Consequently, the amount of the second current I2 is reduced and the voltage level of the second node N2 increases, such that the voltage level of the second node N2 is maintained to be the same as the voltage level of the first node N1. The comparator 430 compares the voltage level of the first node N1 with the voltage level of the second node N2 and controls both the voltage levels to be the same.

The amplifier unit 440 includes first through fifth transistors TR1, TR2, TR3, TR4, and TR5. The first transistor TR1 has a first terminal connected to the power voltage VDD, a gate connected to the ground voltage VSS, and a second terminal connected to an output node OUTN. The first transistor TR1 is a PMOS transistor. Accordingly, the first transistor TR1 is always turned on.

The second transistor TR2 has a first terminal connected to the output node OUTN, a gate to which the external reference signal XVREF is applied, and a second terminal connected to a third node N3. The second transistor TR2 is an NMOS transistor.

The third transistor TR3 has a first terminal connected to the power voltage VDD, a gate connected to the ground voltage VSS, and a second terminal connected to an inverted output node OUTNB. The third transistor TR3 is a PMOS transistor. Accordingly, the third transistor TR3 is always turned on.

The fourth transistor TR4 has a first terminal connected to the inverted output node OUTNB, a gate to which the external input signal XIN is applied, and a second terminal connected to the third node N3. The fourth transistor TR4 is an NMOS transistor.

The fifth transistor TR5 has a first terminal connected to the third node N3, a gate to which the control voltage CTRLV is applied, and a second terminal connected to the ground voltage VSS. The fifth transistor TR5 is an NMOS transistor.

When the level of the external reference signal XVREF or the level of the external input signal XIN is varied, swing ranges and output delay times of data DATA and inverted data DATAB of the amplifier circuit 400 are prevented from varying by using the first and second bias units 410 and 420.

The size of the fifth transistor TR5 is twice that of the sixth bias transistor BTR6. The first bias unit 410 and the second bias unit 420 are respectively half circuits of the amplifier unit 440, as described above.

The first bias unit 410 maintains constant the amount of the first current I1, and the second bias unit 420 responds to the control voltage CTRLV and maintains the amount of the second current I2 to be the same as the amount of the first current I1 although the voltage level of the external reference signal XVREF is varied.

Since the external reference signal XVREF is input to both the fifth bias transistor BTR5 of the second bias unit 420 and the second transistor TR2 of the amplifier unit 440, level variations of the external reference signal XVREF affect equally the second bias unit 420 and the amplifier unit 440.

The control voltage CTRLV maintains constant the amount of the second current I2 although the voltage level of the external reference signal XVREF is varied. The control voltage CTRLV is applied to the gate of the fifth transistor TR5 of the amplifier unit 440, which maintains constant the amount of the third current I3 even though the voltage level of the external reference signal XVREF is varied.

That is, no matter whether the voltage level of the external reference signal XVREF is varied, constant current determined by the first bias unit 410 flows through the amplifier unit 440. Accordingly, the amplifier unit 440 has a stable delay time and a constant output swing range irrespective of variations in the voltage level of the external reference signal XVREF.

For example, if the voltage level of the external reference signal XVREF increases, a degree to which the second transistor TR2 is turned on increases, and the amount of the third current I3 increases. As described previously, the voltage level of the control voltage CTRLV output from the comparison unit 430 is reduced and a degree to which the fifth transistor TR5 is turned on is reduced. Then, the amount of the third current I3 is reduced, and finally, the amount of the third current I3 is maintained constant and the amplifier unit 440 has a constant delay time and a constant output swing range.

Figure 5A:
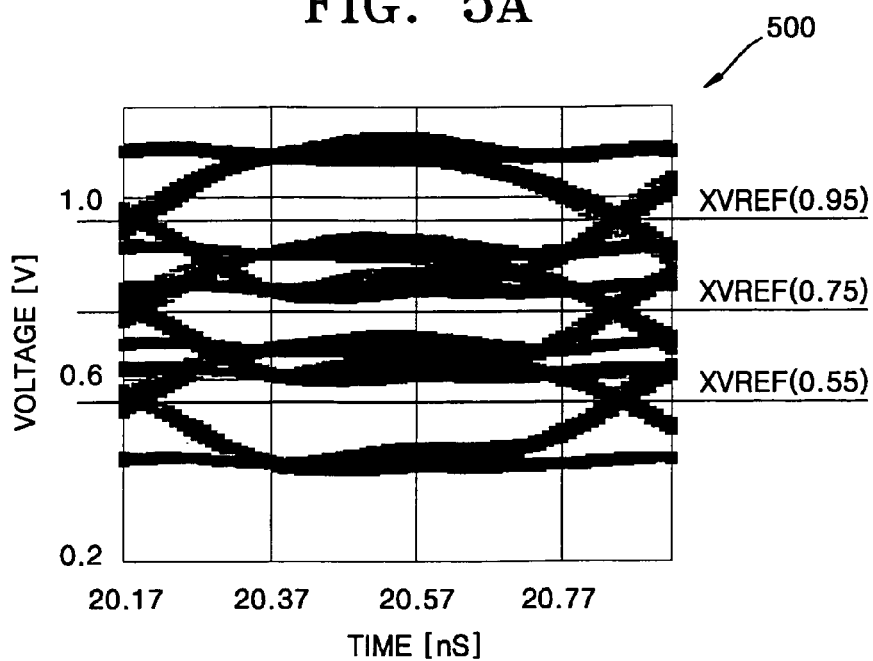
FIG. 5A is a graph illustrating an external input signal and an external reference signal input to the amplifier circuit shown in FIG. 4.
Figure 5B:
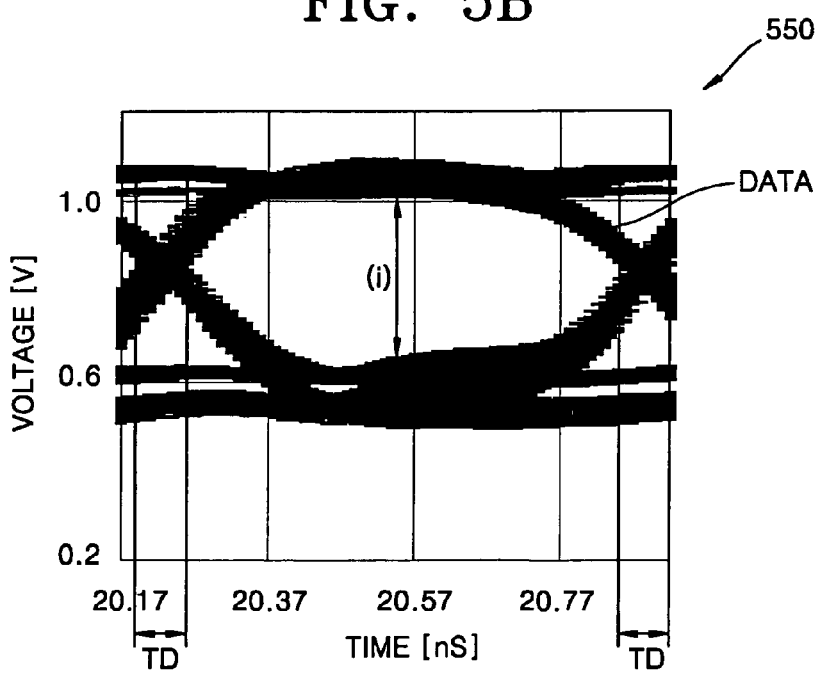
FIG. 5B is a graph illustrating data output from the amplifier circuit shown in FIG. 4.

FIG. 5A is a graph illustrating the external reference signal and the external input signal input to the amplifier circuit shown in FIG. 4. FIG. 5B is a graph illustrating the data output from the amplifier circuit shown in FIG. 4.

Referring to FIG. 5A, the graph 500 shows that the level of the external input signal XIN and the level of the external reference signal XVREF are not constant but are varied. That is, when the level of the external input signal XIN is varied, the level of the external reference signal is varied to 0.55V, 0.75V, and 0.95V.

Figure 2:
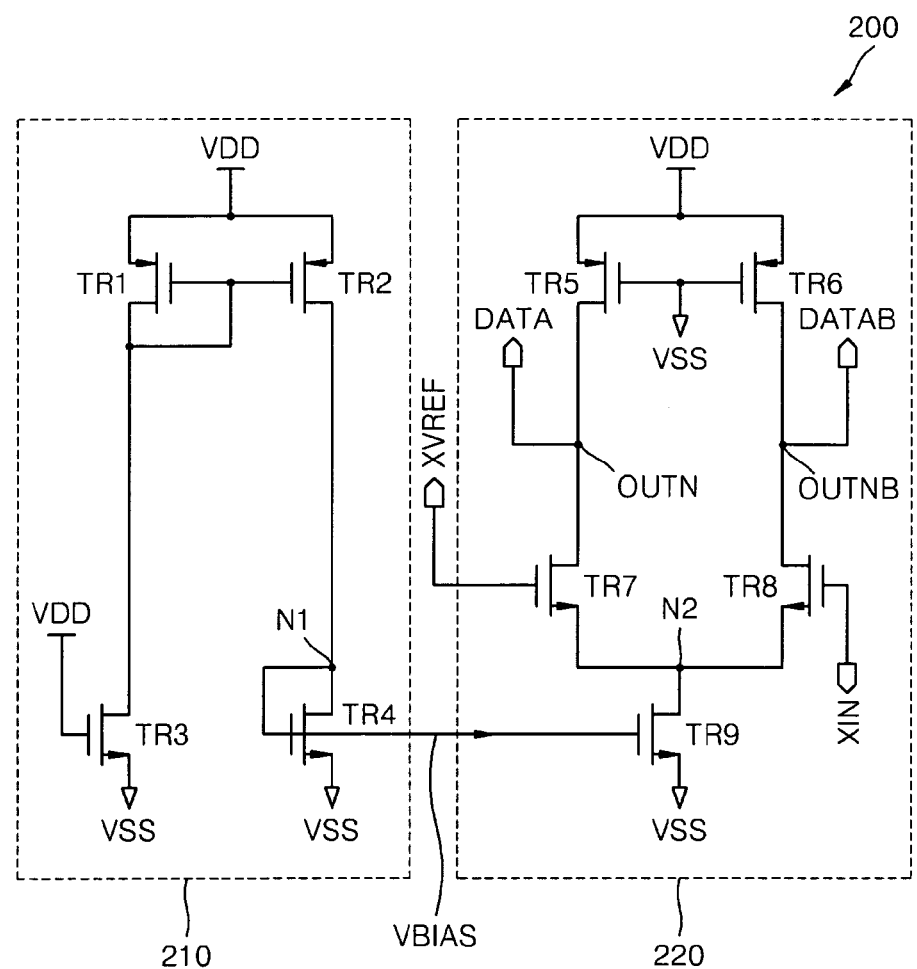
FIG. 2 is a circuit diagram of a conventional amplifier circuit.

In this case, the conventional amplifier circuit 220 of FIG. 2 may suffer problems of inconstant swing ranges of data DATA and inverted data DATAB output therefrom and long output delay times.

Figure 3A:
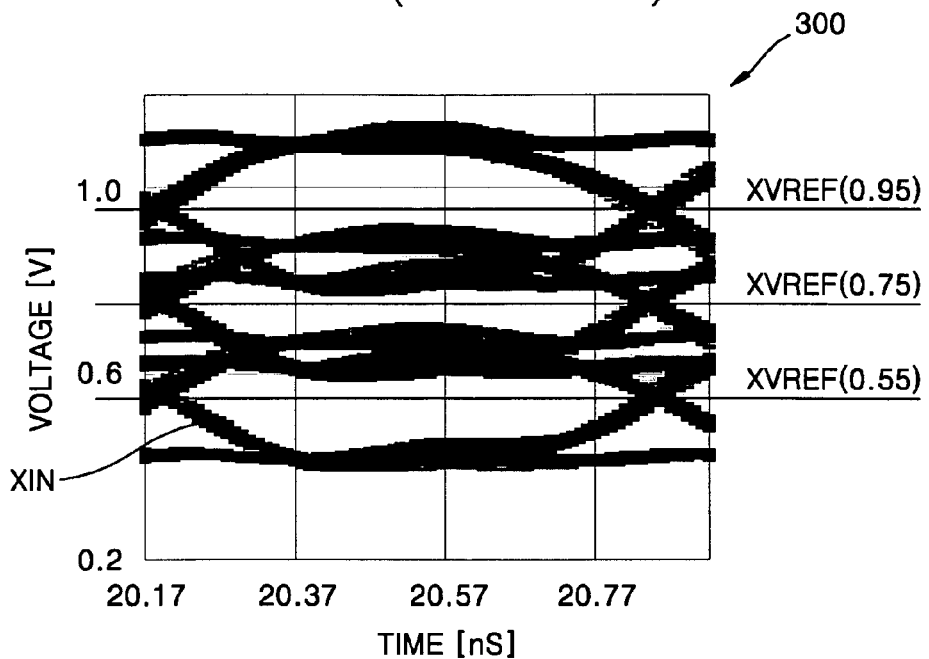
FIG. 3A is a graph illustrating an external input signal and an external reference signal input to the conventional amplifier circuit shown in FIG. 2.
Figure 3B:
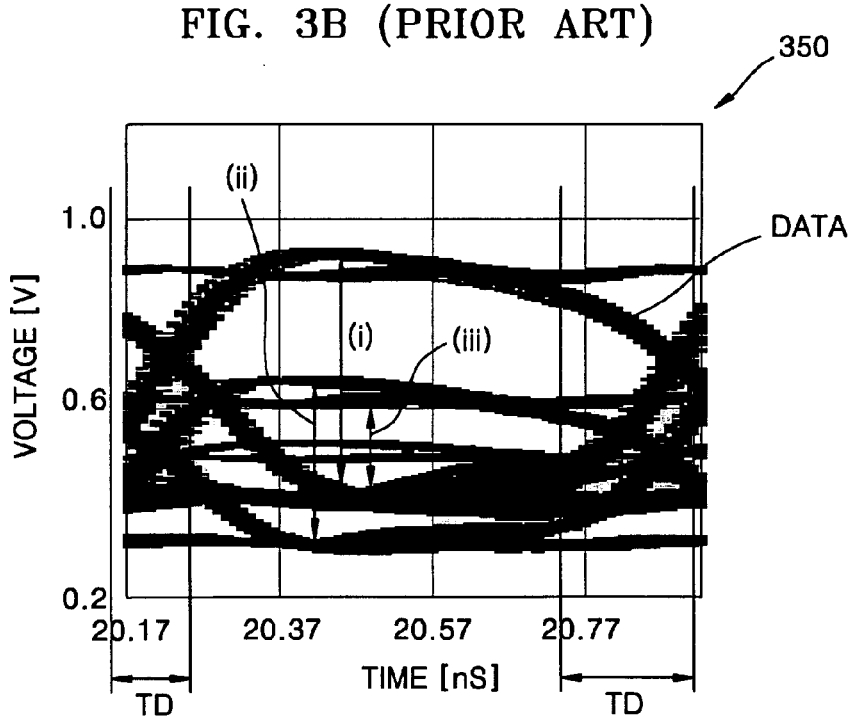
FIG. 3B is a graph illustrating data output from the conventional amplifier circuit shown in FIG. 2.

However, referring to FIG. 5B, the graph 550 shows that a swing range i of the data DATA output from the amplifier unit 440 of the present disclosure is maintained constant. Further, an output delay time TD is shorter than an output delay time TD shown in FIG. 3B.

Figure 6:
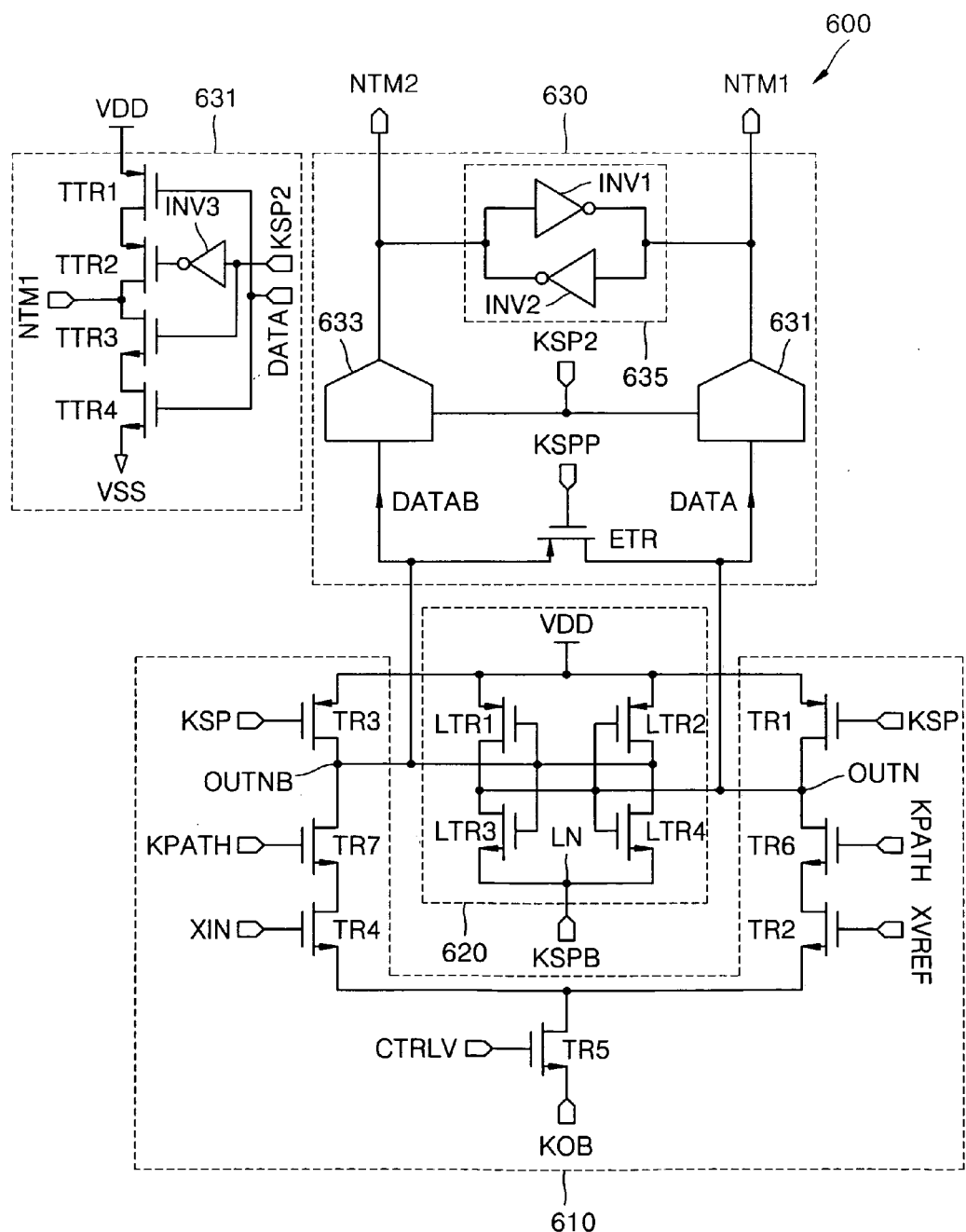
FIG. 6 is a circuit diagram of a circuit for receiving data according to an exemplary embodiment of the present disclosure.

FIG. 6 is a circuit diagram of a circuit for receiving data according to an exemplary embodiment of the present disclosure. Referring to FIG. 6, a circuit 600 for receiving data includes an amplifier circuit 610, an internal latch circuit 620, and an external latch circuit 630.

The amplifier circuit 610 compares a voltage level of an external input signal XIN and a voltage level of an external reference signal XVREF, amplifies and outputs a voltage difference between the two compared signals, responds to a control voltage CTRLV, and maintains constant a swing range of output data.

The internal latch circuit 620 stores and amplifies the data output from the amplifier circuit 610. The external latch circuit 630 stores or outwardly outputs the data output from the internal latch circuit 620.

Figure 7:
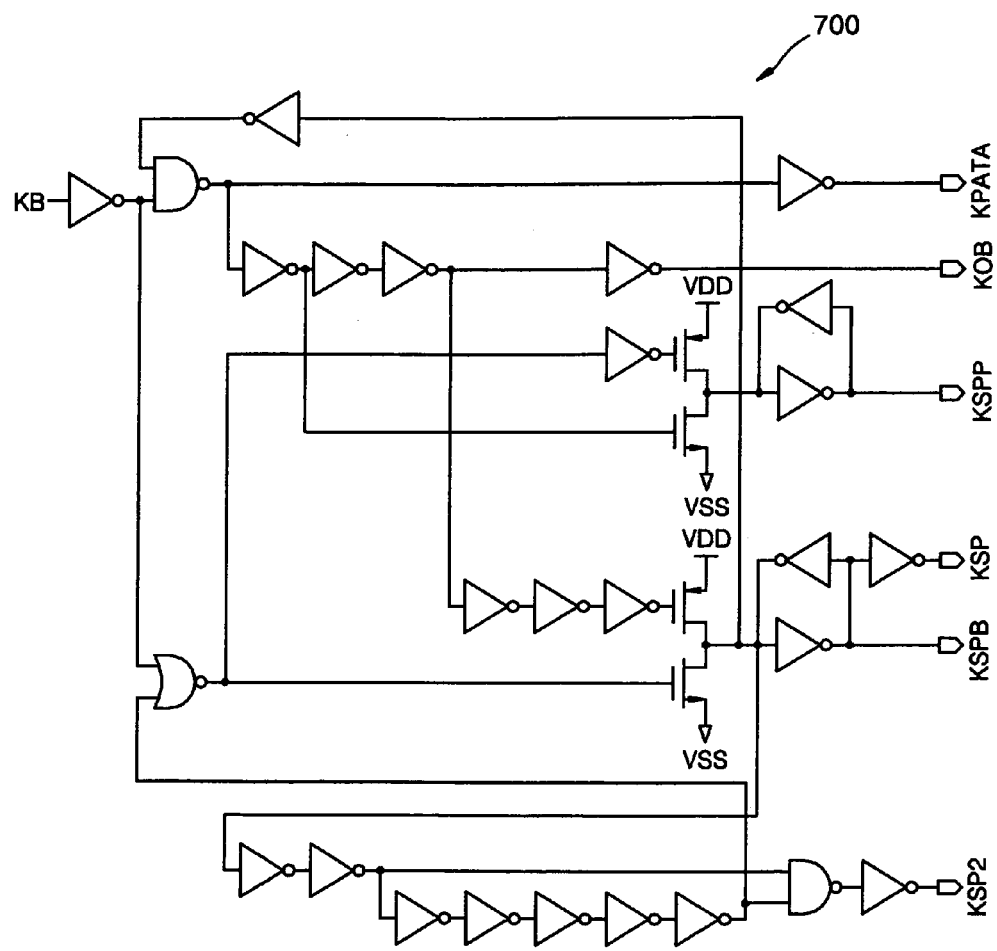
FIG. 7 is a circuit diagram of a pulse generating circuit for generating a driving pulse in the data receiving circuit shown in FIG. 6.

FIG. 7 is a circuit diagram of a pulse generating circuit, which is indicated generally by the reference numeral 700, for generating a driving pulse in the data receiving circuit shown in FIG. 6.

Figure 8:
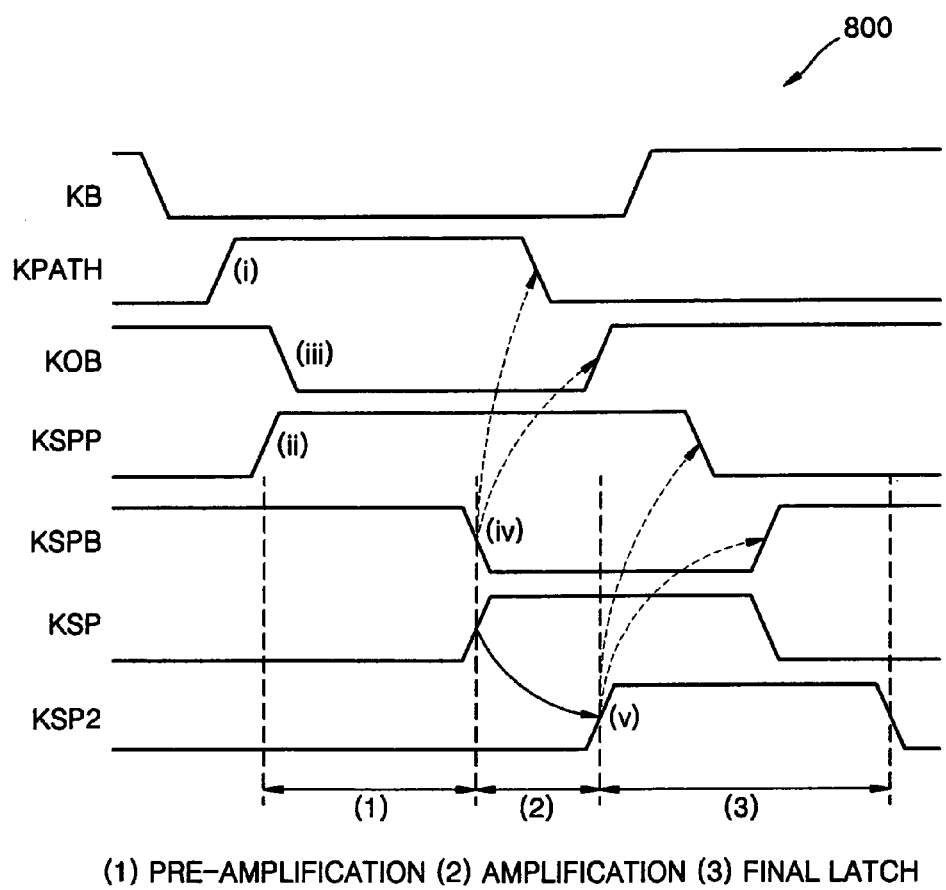
FIG. 8 is a timing diagram for explaining the operation of the data receiving circuit shown in FIG. 6.

FIG. 8 is a timing diagram, which is indicated generally by the reference numeral 800, for explaining the operation of the data receiving circuit shown in FIG. 6.

The operation of the data receiving circuit according to the present embodiment will be explained in detail with reference to FIGS. 6, 7 and 8.

An amplifier includes a first bias unit (not shown), a second bias unit (not shown), a comparison unit (not shown), and an amplifier circuit 610.

The structure and operation of the amplifier is the same as that of the amplifier circuit 400 shown in FIG. 4. For convenience of description of the amplifier circuit 610 shown in FIG. 6, the first bias unit, the second bias unit, and the comparison unit are not illustrated but only the amplifier unit is illustrated.

The first bias unit, the second bias unit, and the comparison unit are identical in structure and operation to the first bias unit 410, the second bias unit 420, and the comparison unit 430 of the amplifier circuit 400 shown in FIG. 4, and accordingly, a detailed explanation thereof will not be given.

The amplifier unit of the amplifier circuit 610 compares the voltage levels of the external input signal XIN and the external reference signal XVREF, amplifies and outputs the voltage difference between the two compared signals, responds to the control voltage CTRLV, and maintains constant the swing range of the output data although the levels of the external reference signal XVREF and the external input signal XIN are varied.

That is, the amplifier circuit 610 maintains constant the swing ranges of the output data DATA and DATAB although the voltage level of the external input signal XIN or the external reference signal XVREF is varied as described above about the amplifier circuit 400 shown in FIG. 4. The amplifier circuit 610 is turned on or off in response to a predetermined amplifier circuit driving pulse KOB.

The internal latch circuit 620 includes first through fourth internal latch transistors LTR1, LTR2, LTR3 and LTR4. The first internal latch transistor LTR1 has a first terminal connected to a power voltage VDD, a gate connected to an inverted output node OUTNB of the amplifier circuit 610, and a second terminal connected to an output node OUTN of the amplifier circuit 610.

The second internal latch transistor LTR2 has a first terminal connected to the power voltage VDD, a gate connected to the output node OUTN of the amplifier circuit 610, and a second terminal connected to the inverted output node OUTNB of the amplifier circuit 610.

The third internal latch transistor LTR3 has a first terminal connected to the output node OUTN, a gate connected to the inverted output node OUTNB, and a second terminal connected to an internal latch node LN. The fourth internal latch transistor LTR4 has a first terminal connected to the inverted output node OUTNB, a gate connected to the output node OUTN, and a second terminal connected to the internal latch node LN. The internal latch node LN receives an internal latch circuit driving pulse KSPB for driving the internal latch circuit 620.

Referring to FIGS. 7 and 8, pulses for driving the data receiving circuit 600 shown in FIG. 6 are generated from a driving pulse KB. If the driving pulse KB is activated to a low level, a pulse KPATH for turning on sixth and seventh transistors TR6 and TR7 of the amplifier circuit 610 changes to a high level as shown in position (i). In order to separate the external latch circuit 630 from the amplifier circuit 610 and the internal latch circuit 620, an equalizing pulse KSPP changes from a low level to a high level as shown in position (ii). The equalizing pulse KSPP will be explained later.

If the equalizing pulse KSPP changes to a high level, the amplifier circuit driving pulse KOB changes to a low level to drive the amplifier circuit 610 as shown in position (iii). At this time, the internal latch circuit driving pulse KSPB for driving the internal latch circuit 620 is maintained at a high level, and a pulse KSP for turning on first and third transistors TR1 and TR3 is maintained at a low level. While the internal latch circuit driving pulse KSPB is maintained at the high level, the internal latch circuit 620 does not operate.

If the amplifier circuit driving pulse KOB changes to the low level, the amplifier circuit 610 amplifies a difference between the external input signal XIN and the external reference signal XVREF and outputs the results to the output node OUTN and the inverted output node OUTNB.

Since the similar operation of the amplifier 610 has already been explained with reference to the amplifier 400 of FIG. 4, a detailed explanation thereof will not be given. The amplifier circuit 610 continues to operate until the internal latch circuit driving pulse KSPB changes to a low level as shown in position (iv). The difference between the external input signal XIN and the external reference signal XVREF is amplified slightly during a time (1) shown in FIG. 8.

Since the internal latch circuit driving pulse KSPB is maintained at the high level while the amplifier circuit 610 operates, the amplifier circuit 610 responds sensitively to a very small difference between the external input signal XIN and the external reference signal XVREF, and is insensitive to an offset of the internal latch circuit 620.

If the internal latch circuit driving pulse KSPB changes to a low level as shown in position (iv), the amplifier circuit driving pulse KOB changes to a high level to turn off the amplifier circuit 610, the first and third transistors TR1 and TR3 are turned off due to the pulse KSP, and the sixth and seventh transistors TR6 and TR7 are turned off due to the pulse KPATH.

If the internal latch circuit driving pulse KSPB changes to the low level, the internal latch circuit 620 operates and the data DATA and the inverted data DATAB respectively output from the output node OUTN and the inverted output node OUTNB are further amplified. The data DATA and the inverted data DATAB are amplified during a time (2) shown in FIG. 2 nearly to a complementary metal oxide semiconductor (CMOS) level due to the internal latch circuit 620.

The data DATA and the inverted data DATAB amplified by the internal latch circuit 620 are applied to first and second transmission units 631 and 633. After a data control pulse KSP2 changes to a high level as shown in position (v), the equalizing pulse KSPP changes to a low level to separate the internal latch circuit 620 from the external latch circuit 630.

The external latch circuit 630 includes an equalization transistor ETR, the first transmission unit 631, the second transmission unit 633, and a latch unit 635. The equalization transistor ETR connects the output node OUTN to the inverted output node OUTNB or cuts off the output node OUTN from the inverted output node OUTNB in response to the equalizing pulse KSPP. While the equalizing pulse KSPP is at the low level, the internal latch circuit 620 is separated from the external latch circuit 630, and if the equalizing pulse KSPP changes to a high level, the data DATA and the inverted data DATAB are transmitted from the internal latch circuit 620 to the external latch circuit 630.

The first transmission unit 631 latches the data DATA output from the output node OUTN or outputs the data DATA through a first transmission node NTM1 in response to the data control pulse KSP2. The second transmission unit 633 latches the inverted data DATAB output from the inverted output node OUTNB or outputs the inverted data DATAB through a second transmission node NTM2 in response to the data control pulse KSP2.

The latch unit 635 is connected between the first transmission node NTM1 and the second transmission node NTM2, and stores the data DATA and the inverted data DATAB respectively output from the first transmission unit 631 and the second transmission unit 633.

The first transmission unit 631 inverts the data DATA output from the output node OUTN and transmits the inverted data to the first transmission node NTM1 if the data control pulse KSP2 is at a first level, and the first transmission unit 631 floats the first transmission node NTM1 if the data control pulse KSP2 is at a second level.

The second transmission unit 633 inverts the inverted data DATAB output from the inverted output node OUTNB and transmits the inverted data to the second transmission node NTM2 if the data control pulse KSP2 is at the first level, and the second transmission unit 633 floats the second transmission node NTM2 if the data control pulse KSP2 is at the second level.

Referring to the first transmission unit 631 shown in FIG. 6, when the data control pulse KSP 2 is at the first level, that is, high level, the data control pulse KSP2 is transmitted to a transistor TTR3, and an inverter INV3 inverts the data control pulse KSP2 and transmits the inverted data to a transistor TTR2.

Accordingly, the transistor TTR3 is turned on and the transistor TT2 is also turned on. Then, the first transmission unit 631 acts as an inverter due to a transistor TTR1 and a transistor TTR4, and inverts the data DATA and transmits the inverted data to the first transmission node NTM1.

If the data control pulse KSP2 is at the second level, that is, low level, the transistors TTR2 and TTR3 are turned off and the first transmission node NTM1 is floated. If the first transmission node NTM1 and the second transmission node NTM2 are floated, the data DATA and the inverted data DATAB are stored in the latch unit 635 that includes inverters INV1 and INV2. The operation of the second transmission unit 633 works like the described operation of the first transmission unit 631, but with the signal DATAB rather than the signal DATA.

The data DATA and the inverted data DATAB are stored in the external latch unit 635 or output through the first and second transmission nodes NTM1 and NTM2 during a time (3) shown in FIG. 8. The data receiving circuit 600 shown in FIG. 6 can have a constant output swing range by employing the amplifier circuit 400 shown in FIG. 4, and can reduce total current consumption by reducing the time (1), that is, operating time of the amplifier circuit 610, shown in FIG. 8.

As described above, the amplifier circuit and the data receiving circuit embodiments according to the present disclosure have an advantage of maintaining a constant output swing range and a stable delay time irrespective of variations in the voltage level of the external input signal or the external reference signal.

While the present invention has been particularly shown and described with reference to exemplary embodiments thereof, it will be understood by those of ordinary skill in the pertinent art that various changes in form and details may be made therein without departing from the spirit and scope of the present invention as defined by the following claims.

What is claimed is:

1. An amplifier circuit comprising:
   a first bias unit, which responds to an internal reference signal with a predetermined voltage level and maintains constant the amount of a first current;
   a second bias unit, which receives an external reference signal, responds to a control voltage, and controls the amount of a second current to be same as the amount of the first current;
   a comparison unit, which compares a voltage level of a first node of the first bias unit with a voltage level of a second node of the second bias unit and controls a voltage level of the control voltage according to the comparison result; and
   an amplifier unit, which compares a voltage level of an external input signal and a voltage level of the external reference signal, amplifies and outputs a voltage difference between the external input signal and the external reference signal, responds to the control voltage, and controls the amount of a third current to be same as the amount of the first current although the level of the external reference signal is varied.

2. The amplifier circuit of claim 1, wherein the first current flows through the first node, the second current flows through the second node, and the amount of the second current is varied in response to the voltage level of the external reference signal.

3. The amplifier circuit of claim 1, wherein the first bias unit comprises:
- a first bias transistor, which has a first terminal connected to a power voltage, a gate connected to a ground voltage, and a second terminal connected to the first node;
- a second bias transistor, which has a first terminal connected to the first node, and a gate to which the internal reference signal is applied; and
- a third bias transistor, which has a first terminal connected to a second terminal of the second bias transistor, a gate to which the internal reference signal is applied, and a second terminal connected to the ground voltage.

4. The amplifier circuit of claim 3, wherein the internal reference signal makes the second bias transistor and the third bias transistor turned on to maintain constant the amount of the first current.

5. The amplifier circuit of claim 1, wherein the second bias unit comprises:
- a fourth bias transistor, which has a first terminal connected to a power voltage, a gate connected to a ground voltage, and a second terminal connected to the second node;
- a fifth bias transistor, which has a first terminal connected to the second node, and a gate to which the external reference signal is applied; and
- a sixth bias transistor, which has a first terminal connected to a second terminal of the fifth bias transistor, a gate to which the control voltage is applied, and a second terminal connected to the ground voltage.

6. The amplifier circuit of claim 5, wherein the control voltage controls a degree to which the sixth bias transistor is turned on and controls the amount of the second current to be the same as the amount of the first current.

7. The amplifier circuit of claim 5, wherein the comparison unit has a negative terminal connected to the first node and a positive terminal connected to the second node, and reduces the voltage level of the control voltage if the voltage level of the second node is higher than the voltage level of the first node and increases the voltage level of the control voltage if the voltage level of the second node is lower than the voltage level of the first node.

8. The amplifier circuit of claim 5, wherein the amplifier unit comprises:
- a first transistor, which has a first terminal connected to the power voltage, a gate to which a ground voltage is connected, and a second terminal connected to an output node;
- a second transistor, which has a first terminal connected to the output node, a gate to which the external reference signal is applied, and a second terminal connected to a third node;
- a third transistor, which has a first terminal connected to the power voltage, a gate connected to the ground voltage, and a second terminal connected to an inverted output node;
- a fourth transistor, which has a first terminal connected to the inverted output node, a gate to which the external input signal is applied, and a second terminal connected to the third node; and
- a fifth transistor, which has a first terminal connected to the third node, a gate to which the control voltage is applied, and a second terminal connected to the ground voltage.

9. The amplifier circuit of claim 8, wherein the size of the fifth transistor is twice that of the sixth bias transistor.

10. A circuit comprising:
- a first bias unit responsive to an internal reference signal with a predetermined voltage level for maintaining a first current substantially constant;
- a second bias unit in signal communication with the first bias unit, responsive to a control voltage for receiving an external reference signal and controlling a second current to be substantially the same amount as the first current;
- a comparison unit in signal communication with the first and second bias units for comparing a voltage level of a first node of the first bias unit with a voltage level of a second node of the second bias unit and controlling a voltage level of the control voltage according to the comparison result; and
- an amplifier unit in signal communication with the comparison unit responsive to the control voltage for comparing a voltage level of an external input signal and a voltage level of the external reference signal, amplifying and outputting a voltage difference between the external input signal and the external reference signal and controlling a third current to be same as the amount of the first current even though the level of the external reference signal is varied.

11. The circuit as defined in claim 10, further comprising:
- an internal latch circuit storing and amplifying the data output from the amplifier unit; and
- an external latch circuit in signal communication with the internal latch circuit for at least one of storing and outputting data output from the internal latch circuit.

12. The circuit as defined in claim 11, wherein the first bias unit comprises:
- a first bias transistor having a first terminal connected to a power voltage, a gate connected to a ground voltage, and a second terminal connected to the first node;
- a second bias transistor having a first terminal connected to the first node, and a gate to which the internal reference signal is applied; and
- a third bias transistor having a first terminal connected to a second terminal of the second bias transistor, a gate to which the internal reference signal is applied, and a second terminal connected to the ground voltage.

* * * * *